United States Patent
Hwang et al.

(10) Patent No.: US 9,224,886 B2
(45) Date of Patent: Dec. 29, 2015

(54) SILICON THIN FILM SOLAR CELL

(75) Inventors: Suntae Hwang, Seoul (KR); Sehwon Ahn, Seoul (KR); Seungyoon Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 823 days.

(21) Appl. No.: 13/012,428

(22) Filed: Jan. 24, 2011

(65) Prior Publication Data

US 2011/0139232 A1 Jun. 16, 2011

(30) Foreign Application Priority Data

Feb. 10, 2010 (KR) ........................ 10-2010-0012287

(51) Int. Cl.
  *H01L 31/00* (2006.01)
  *H01L 31/0224* (2006.01)
  *H01L 31/056* (2014.01)

(52) U.S. Cl.
  CPC ...... *H01L 31/022425* (2013.01); *H01L 31/056* (2014.12); *Y02E 10/52* (2013.01)

(58) Field of Classification Search
  USPC .................................. 136/255, 256, 258, 261
  See application file for complete search history.

(56) References Cited

U.S. PATENT DOCUMENTS

2006/0174935 A1* 8/2006 Sawada et al. ................ 136/261
2006/0249197 A1* 11/2006 Shima et al. .................. 136/246
2007/0221269 A1  9/2007 Sakai et al.
2008/0092954 A1  4/2008 Choi

FOREIGN PATENT DOCUMENTS

| CN | 101556971 A | 10/2009 | |
| EP | 2 128 904 A2 | 12/2009 | |
| JP | 2003-298088 | * 10/2003 | ............. H01L 31/04 |
| JP | 2006-310348 A | 11/2006 | |
| KR | 10-0495925 B1 | 6/2005 | |

OTHER PUBLICATIONS

English machine translation of JP 2003-298088, Oct. 2003, 15 pages.*
Buehlmann et al., "Conducting two-phase silicon oxide layers for thin-film silicon solar cells", Materials Research Society, vol. 1123, 2009, pp. 1-6.*
Shah et al., "Microcrystalline silicon and 'micromorph' tandem solar cells", Thin Solid Films 403-404, 2002, pp. 179-187.*
Srikant et al., "On the optical band gap of zinc oxide", Journal of Applied Physics, vol. 83, No. 10, May 1998, pp. 5447-5451.*

(Continued)

*Primary Examiner* — Thanh-Truc Trinh
(74) *Attorney, Agent, or Firm* — Birch, Stewart, Kolasch & Birch, LLP

(57) ABSTRACT

A silicon thin film solar cell is discussed. The silicon thin film solar cell includes a substrate on which light is incident, a first electrode positioned on the substrate at a surface opposite a surface of the substrate on which the solar light is incident, a second electrode positioned on the first electrode, at least one photoelectric conversion unit positioned between the first electrode and the second electrode, and a back reflection layer positioned between the at least one photoelectric conversion unit and the second electrode. The back reflection layer includes a first reflection layer formed of a material having an absorption coefficient equal to or less than 400 $cm^{-1}$ with respect to light having a wavelength equal to or greater than 700 nm.

14 Claims, 7 Drawing Sheets

(56) References Cited

OTHER PUBLICATIONS

Das et al., "Performance of superstrate multijunction amorphous silicon-based solar cells using optical layers for current management", Solar Energy Materials and Solar Cells, Elsevier Science Publishers, Amsterdam, Nl, vol. 93, No. 6-7, Jun. 1, 2009, XP026093548.

Huang et al., "Influences of annealing temperature on the optical properties of SiOx thin film prepared by reactive magnetron sputtering", Applied Surface Science, Elsevier, Amsterdam, NL, vol. 255, No. 5, Dec. 30, 2008, XP025711730.

Springer et al., "Absorption loss at nanorough silver back reflector of thin-film silicon solar cells", Journal of Applied Physics, American Institute of Physics, New York, vol. 95, No. 3, Feb. 1, 2004, XP012067306.

* cited by examiner

Light

| Wavelength(nm) | Ratio of EQE(B/A) |
|---|---|
| 600 | 1.00 |
| 700 | 1.03 |
| 800 | 1.06 |
| 900 | 1.10 |
| 1000 | 1.10 |
| 1100 | 1.14 |

|  | ZnO:Al | n-SiOx:H |
|---|---|---|
| Voc (V) | 1.39 | 1.40 |
| Jsc (mA/cm2) | 11.3 | 11.7 |
| F.F. | 0.71 | 0.71 |
| Eff | 11.2 | 11.6 |
| QEJsc (Top) | 11.7 | 11.7 |
| QEJsc (Bot) | 11.3 | 11.9 |
| QEJsc (Tot) | 23.0 | 23.6 |

Light

SILICON THIN FILM SOLAR CELL

This application claims priority to and the benefit of Korean Patent Application No. 10-2010-0012287 filed in the Korean Intellectual Property Office on Feb. 10, 2010, the entire contents of which are incorporated herein by reference.

BACKGROUND OF THE INVENTION

1. Field of the Invention

Embodiments of the invention relate to a silicon thin film solar cell including a back reflection layer formed of hydrogenated microcrystalline silicon oxide.

2. Description of the Related Art

Solar cells use an infinite energy source, i.e., the sun as an energy source, scarcely produce pollution materials in an electricity generation process, and have a very long life span equal to or longer than 20 years. Furthermore, the solar cells have been particularly spotlighted because of a large ripple effect on the solar related industries. Thus, many countries have fostered the solar cells as a next generation industry.

Most of the solar cells have been manufactured based on a single crystal silicon wafer or a polycrystalline silicon wafer. In addition, thin film solar cells using silicon have been manufactured in lesser quantities.

The solar cells have the problem of the high electricity generation cost compared to other energy sources. Thus, the electricity generation cost of the solar cells has to be greatly reduced so as to meet a future demand for clean energy.

However, because a bulk silicon solar cell manufactured based on the single crystal silicon wafer or the polycrystalline silicon wafer now uses a raw material having a thickness of at least 150 μm, the raw material cost, i.e., the cost of silicon cost makes up most of the production cost of the bulk silicon solar cell. Further, because the supply of the raw material does not meet the rapidly increasing demand, it is difficult to reduce the production cost of the bulk silicon solar cell.

On the other hand, because a thickness of the thin film solar cell is less than 2 μm, an amount of raw material used in the thin film solar cell is much less than an amount of raw material used in the bulk silicon solar cell. Thus, the thin film solar cell is more advantageous than the bulk silicon solar cell in terms of the electricity generation cost, i.e., the production cost. However, an electricity generation performance of the thin film solar cell is one half of an electricity generation performance of the bulk silicon solar cell given the same area.

The efficiency of the solar cell is generally expressed by a magnitude of a power obtained at a light intensity of 100 mW/cm$^2$ in terms of percentage. The efficiency of the bulk silicon solar cell is about 12% to 20%, and the efficiency of the thin film solar cell is about 8% to 9%. In other words, the efficiency of the bulk silicon solar cell is greater than the efficiency of the thin film solar cell.

Accordingly, much effort has been expended to increase the efficiency of the thin film solar cell. As a result, a double junction thin film solar cell and a triple junction thin film solar cell have been developed.

The most basic structure of the thin film solar cell is a single junction structure. A single junction thin film solar cell has a structure in which a photoelectric conversion unit including an intrinsic semiconductor layer corresponding to a light absorption layer, a p-type doped layer, and an n-type doped layer is formed on a substrate. The p-type doped layer and the n-type doped layer are respectively formed on and under the intrinsic semiconductor layer, thereby forming an inner electric field for separating carriers produced by solar light.

The efficiency of the single junction thin film solar cell including the one photoelectric conversion unit is low. Thus, a double junction thin film solar cell including the two photoelectric conversion units and a triple junction thin film solar cell including the three photoelectric conversion units have been developed, so as to increase the efficiency of the thin film solar cell Each of the double junction thin film solar cell and the triple junction thin film solar cell have the configuration in which a first photoelectric conversion unit first absorbing solar light is formed of a semiconductor material (for example, amorphous silicon) having a wide band gap and absorbs solar light of a short wavelength band, and a second photoelectric conversion unit later absorbing the solar light is formed of a semiconductor material (for example, microcrystalline silicon) having a narrow band gap and absorbs solar light of a long wavelength band. Hence, the efficiency of each of the double junction thin film solar cell and the triple junction thin film solar cell is greater than the efficiency of the single junction thin film solar cell.

The increase in the efficiency of the silicon thin film solar cell requires an increase in a current density flowing in the silicon thin film solar cell. Thus, the silicon thin film solar cell has to be configured so that solar light passing through the intrinsic semiconductor layer is reflected back towards the intrinsic semiconductor layer and then is absorbed in the intrinsic semiconductor layer. As a result, the silicon thin film solar cell includes a back reflection layer for increasing a light absorptance of the intrinsic semiconductor layer, thereby increasing the current density.

SUMMARY OF THE INVENTION

In one aspect, there is a silicon thin film solar cell including a substrate on which solar light is incident, a first electrode positioned on the substrate a surface opposite a surface of the substrate on which the solar light is incident, a second electrode positioned on the first electrode, at least one photoelectric conversion unit positioned between the first electrode and the second electrode, and a back reflection layer positioned between the at least one photoelectric conversion unit and the second electrode, the back reflection layer including a first reflection layer formed of a material having an absorption coefficient equal to or less than 400 cm$^{-1}$ with respect to light having a wavelength equal to or greater than 700 nm.

The first reflection layer may be formed of hydrogenated microcrystalline silicon oxide (μc-SiOx:H).

The at least one photoelectric conversion unit may have one of a single junction structure, a double junction structure, and a triple junction structure.

When the at least one photoelectric conversion unit has the single junction structure, an intrinsic semiconductor layer of the at least one photoelectric conversion unit may be formed of amorphous silicon or microcrystalline silicon.

When the at least one photoelectric conversion unit has the double junction structure, an intrinsic semiconductor layer of a first photoelectric conversion unit positioned on the first electrode may be formed of amorphous silicon, and an intrinsic semiconductor layer of a second photoelectric conversion unit positioned on the first photoelectric conversion unit may be formed of microcrystalline silicon.

When the at least one photoelectric conversion unit has the triple junction structure, an intrinsic semiconductor layer of a first photoelectric conversion unit positioned on the first electrode and an intrinsic semiconductor layer of a second photoelectric conversion unit positioned on the first photoelectric conversion unit may be formed of amorphous silicon, and an intrinsic semiconductor layer of a third photoelectric conversion unit positioned on the second photoelectric conversion unit may be formed of microcrystalline silicon.

When the at least one photoelectric conversion unit has one of the double junction structure and the triple junction structure, at least one middle reflection layer may be positioned between the photoelectric conversion units. The at least one middle reflection layer may be formed using one of hydrogenated microcrystalline silicon oxide (μc-SiOx:H) and Al-doped zinc oxide (ZnO:Al).

The back reflection layer may further include a second reflection layer formed of a material having an absorption coefficient equal to or greater than 400 cm$^{-1}$ with respect to light having a wavelength equal to or greater than 700 nm. An electrical conductivity of the second reflection layer may be greater than an electrical conductivity of the first reflection layer. The second reflection layer may be formed of Al-doped zinc oxide (ZnO:Al). The second reflection layer may be positioned on the first reflection layer.

When the back reflection layer includes the first and second reflection layers, at least one middle reflection layer may be positioned between the photoelectric conversion units in the double junction or triple junction silicon thin film solar cell.

According to the above-described characteristics, because the first reflection layer of the back reflection layer is formed of hydrogenated microcrystalline silicon oxide (μc-SiOx:H), the solar light having a long wavelength reaching the second reflection layer of the back reflection layer may be efficiently reflected. Hence, a current of the second reflection layer may increase.

When the back reflection layer includes the first reflection layer formed of hydrogenated microcrystalline silicon oxide (μc-SiOx:H) and the second reflection layer formed of Al-doped zinc oxide (ZnO:Al), a thickness of the first reflection layer may be reduced. Hence, process time and the manufacturing cost required to deposit the back reflection layer including only the first reflection layer may decrease.

Furthermore, when both of the at least one middle reflection layer and the back reflection layer is formed of hydrogenated microcrystalline silicon oxide (μc-SiOx:H), a thickness of each reflection layer may be optimized.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
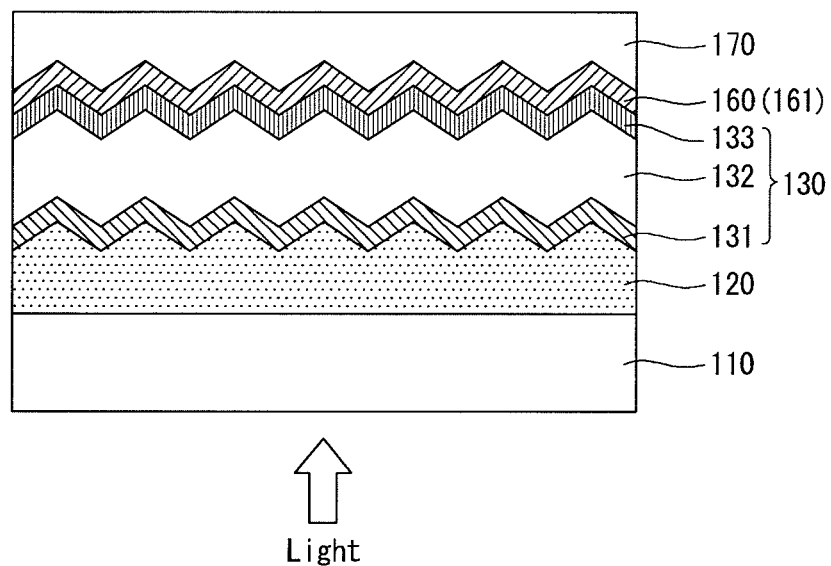
FIG. 1 is a partial cross-sectional view schematically illustrating a single junction silicon thin film solar cell according to a first example embodiment of the invention.

Embodiments of the invention will be described more fully hereinafter with reference to the accompanying drawings, in which example embodiments of the invention are shown. This invention may, however, be embodied in many different forms and should not be construed as limited to the embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, it will be understood that when an element such as a layer, film, region, or substrate is referred to as being "entirely" on another element, it may be on the entire surface of the other element and may not be on a portion of an edge of the other element.

Reference will now be made in detail to embodiments of the invention, examples of which are illustrated in the accompanying drawings.

FIG. 1 schematically illustrates a silicon thin film solar cell according to a first example embodiment of the invention. More specifically, FIG. 1 is a partial cross-sectional view of a single junction silicon thin film solar cell according to the first example embodiment of the invention.

As shown in FIG. 1, a single junction silicon thin film solar cell according to the first example embodiment of the invention has a superstrate structure in which light is incident through a substrate 110.

More specifically, the single junction silicon thin film solar cell according to the first example embodiment of the invention includes a substrate 110, which may be formed of glass or transparent plastic, etc., a transparent conductive oxide (TCO) electrode 120 positioned on the substrate 110, a first photoelectric conversion unit 130 positioned on the TCO electrode 120, a back reflection layer 160 positioned on the first photoelectric conversion unit 130, and a back electrode 170 positioned on the back reflection layer 160. In the embodiment of the invention, the TCO electrode 120 may be referred to as a first electrode and the back electrode 170 may be referred to as a second electrode.

The TCO electrode 120 is formed on the entire surface of the substrate 110 and is electrically connected to the first photoelectric conversion unit 130. Thus, the TCO electrode 120 collects carriers (for example, holes) produced by light and outputs the carriers. Further, the TCO electrode 120 may serve as an anti-reflection layer.

An upper surface of the TCO electrode 120 is textured to form a textured surface having a plurality of uneven portions, each of which may have a non-uniform pyramid shape. When the upper surface of the TCO electrode 120 is the textured surface, a light reflectance of the TCO electrode 120 is reduced. Hence, a light absorptance of the TCO electrode 120 increases, and efficiency of the single junction silicon thin film solar cell is improved. Heights of the uneven portions of the TCO electrode 120 may be within the range of about 1 μm to 10 μm.

A high transmittance and high electrical conductivity are required in the TCO electrode 120, so that the TCO electrode 120 can transmit most of incident light and electric current smoothly flows in the TCO electrode 120. The TCO electrode 120 may be formed of at least one selected from the group consisting of indium tin oxide (ITO), tin-based oxide (for example, $SnO_2$), AgO, $ZnO—Ga_2O_3$, $Al_2O_3$, fluorine tin oxide (FTO), and a combination thereof. A specific resistance of the TCO electrode 120 may be approximately $10^{-2}$ Ω·cm to $10^{-11}$ Ω·cm.

The first photoelectric conversion unit 130 may be formed of hydrogenated amorphous silicon (a-Si:H). The first photoelectric conversion unit 130 has an optical band gap of about 1.7 eV and mostly absorbs light of a short wavelength band such as near ultraviolet light, purple light, and/or blue light.

The first photoelectric conversion unit 130 includes a semiconductor layer (for example, a first p-type doped layer) 131 of a first conductive type, a first intrinsic semiconductor layer 132, and a semiconductor layer (for example, a first n-type doped layer) 133 of a second conductive type opposite the first conductive type, that are sequentially formed on the TCO electrode 120.

The first p-type doped layer 131 may be formed by adding a gas containing impurities of a group III element such as boron (B), gallium (Ga), and indium (In) to a raw gas containing silicon (Si). In the embodiment of the invention, the first p-type doped layer 131 may be formed of hydrogenated amorphous silicon (a-Si:H) or using other materials.

The first intrinsic semiconductor layer 132 prevents or reduces a recombination of carriers and absorbs light. The carriers (i.e., electrons and holes) are mostly produced in the first intrinsic semiconductor layer 132. The first intrinsic semiconductor layer 132 may have a thickness of about 200 nm to 300 nm. The first intrinsic semiconductor layer 132 may be formed of hydrogenated amorphous silicon (a-Si:H) or using other materials. For example, the first intrinsic semiconductor layer 132 may be formed of microcrystalline silicon (μc-Si) or hydrogenated microcrystalline silicon (μc-Si:H).

The first n-type doped layer 133 may be formed by adding a gas containing impurities of a group V element such as phosphorus (P), arsenic (As), and antimony (Sb) to a raw gas containing silicon (Si).

The first photoelectric conversion unit 130 may be formed using a chemical vapor deposition (CVD) method such as a plasma enhanced CVD (PECVD) method.

The first p-type doped layer 131 and the first n-type doped layer 133 of the first photoelectric conversion unit 130 form a p-n junction with the first intrinsic semiconductor layer 132 interposed therebetween. Hence, electrons and holes produced in the first intrinsic semiconductor layer 132 are separated by a contact potential difference resulting from a photovoltaic effect and move in different directions. For example, the holes move to the TCO electrode 120 through the first p-type doped layer 131, and the electrons move to the back electrode 170 through the first n-type doped layer 133.

The back reflection layer 160 reflects light passing through the first photoelectric conversion unit 130 back towards the first photoelectric conversion unit 130, thereby improving an operation efficiency of the first photoelectric conversion unit 130. The back reflection layer 160 includes a first reflection layer 161.

In the related art, the back reflection layer is formed of aluminum (Al)-doped zinc oxide (ZnO:Al). Al-doped zinc oxide (ZnO:Al) has a high absorptance with respect to a component of solar light having a wavelength equal to or greater than 700 nm. However, the solar light reaching the back reflection layer is generally a long-wavelength light component having a wavelength equal to or greater than 700 nm. Thus, most of the long-wavelength light reaching the back reflection layer in the related art is absorbed in the back reflection layer. As a result, a loss of light increases.

To prevent or reduce the absorption of the long-wavelength light in the back reflection layer, in the embodiment of the invention, the first reflection layer 161 is formed using a material (for example, hydrogenated microcrystalline silicon oxide (μc-SiOx:H)) having an absorption coefficient equal to or less than 400 cm$^{-1}$ with respect to the component of solar light having the wavelength equal to or greater than 700 nm. In embodiments of the invention, reference to absorption coefficient includes a relationship referred to as Beer-Lambert law, whereby an intensity I of light transmitted through a layer of material with a thickness x is related to an incident intensity $I_0$ according to an inverse exponential power law $I=I_0 e^{-\alpha x}$, where x denotes the path length and α is the absorption coefficient.

Figure 2:
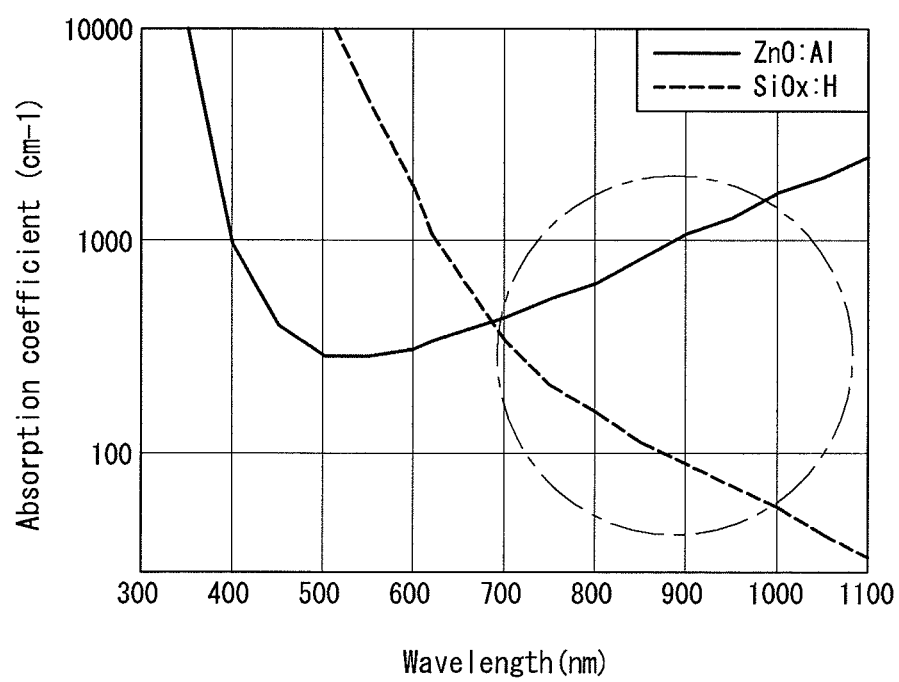
FIG. 2 is a graph illustrating a light absorption coefficient depending on a formation material of a first reflection layer.

As shown in FIG. 2, hydrogenated microcrystalline silicon oxide (μc-SiOx:H) has a very small absorption coefficient with respect to the component of solar light having the wavelength equal to or greater than 700 nm, compared to Al-doped zinc oxide (ZnO:Al). Thus, the back reflection layer 160 including the first reflection layer 161 formed of hydrogenated microcrystalline silicon oxide (μc-SiOx:H) does not absorb most of the long-wavelength light reaching the back reflection layer 160 and transmits or reflects most of the long-wavelength light reaching the back reflection layer 160. As a result, a loss of light may be minimized.

The first reflection layer 161 formed of hydrogenated microcrystalline silicon oxide (μc-SiOx:H) has conductivity less than the back reflection layer formed of Al-doped zinc oxide (ZnO:Al). However, the conductivity of the first reflection layer 161 may be properly controlled by controlling an injection amount of oxygen in the formation of the first reflection layer 161. Hence, the problem resulting from a reduction in the conductivity of the first reflection layer 161 may be prevented or reduced. A thickness of the first reflection layer 161 may be properly set to several tens of nanometers (nm) to several micrometers (μm).

The back electrode 170 is formed on the entire surface of the back reflection layer 160 and is electrically connected to the first n-type doped layer 133 of the first photoelectric conversion unit 130. The back electrode 170 collects carriers (for example, electrons) produced by the p-n junction and outputs the carriers The first p-type doped layer 131, the first intrinsic semiconductor layer 132, and the first n-type doped layer 133 of the first photoelectric conversion unit 130 and the back reflection layer 160 may have a textured surface, so as to increase an absorption of light by the single junction silicon thin film solar cell.

Hereinafter, a modification embodiment of the single junction silicon thin film solar cell shown in FIG. 1 is described with reference to FIGS. 3 to 5. In the first example embodiment illustrated in FIG. 1, process time and the manufacturing cost required to deposit the back reflection layer 160 including only the first reflection layer 161 may increase compared to the back reflection layer formed of Al-doped zinc oxide (ZnO:Al).

Figure 3:
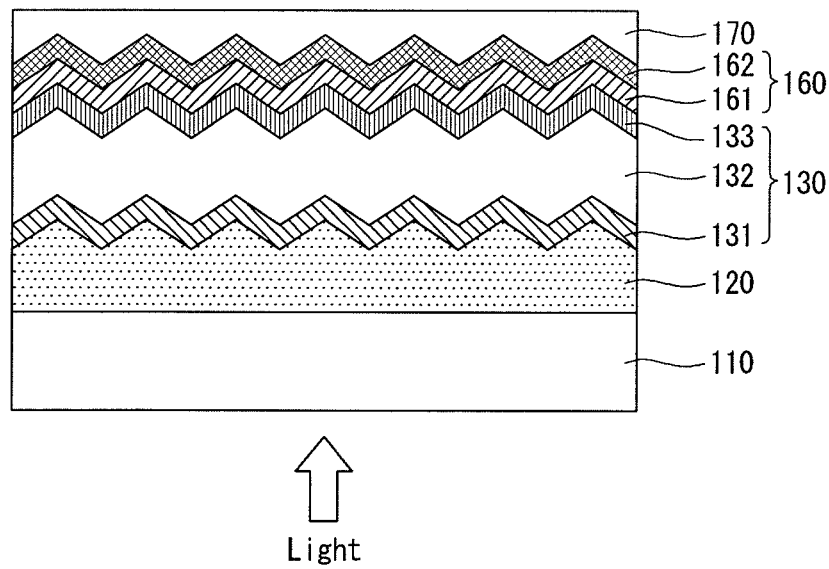
FIG. 3 is a partial cross-sectional view illustrating a modification embodiment of the single junction silicon thin film solar cell shown in FIG. 1.

As shown in FIG. 3, in the modification embodiment of the invention, the back reflection layer 160 may include a first reflection layer 161 formed of hydrogenated microcrystalline silicon oxide (μc-SiOx:H) and a second reflection layer 162 formed of Al-doped zinc oxide (ZnO:Al). In this instance, because the first reflection layer 161 shown in FIG. 3 may be formed to be thinner than the first reflection layer 161 shown in FIG. 1, an increase in process time and the manufacturing cost required to form the back reflection layer 160 of FIG. 3 may be minimized. Additionally, an electrical conductivity of the second reflection layer 162 may be greater than an electrical conductivity of the first reflection layer 161.

Figure 4:
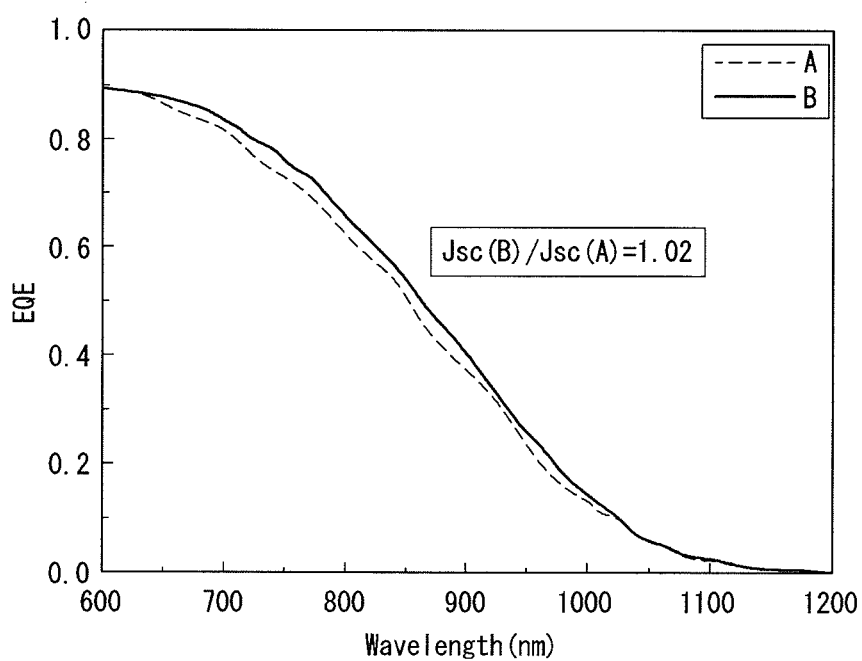
FIG. 4 is a graph of a quantum efficiency versus a long wavelength band in the modification embodiment shown in FIG. 3.
Figures 5, 6:
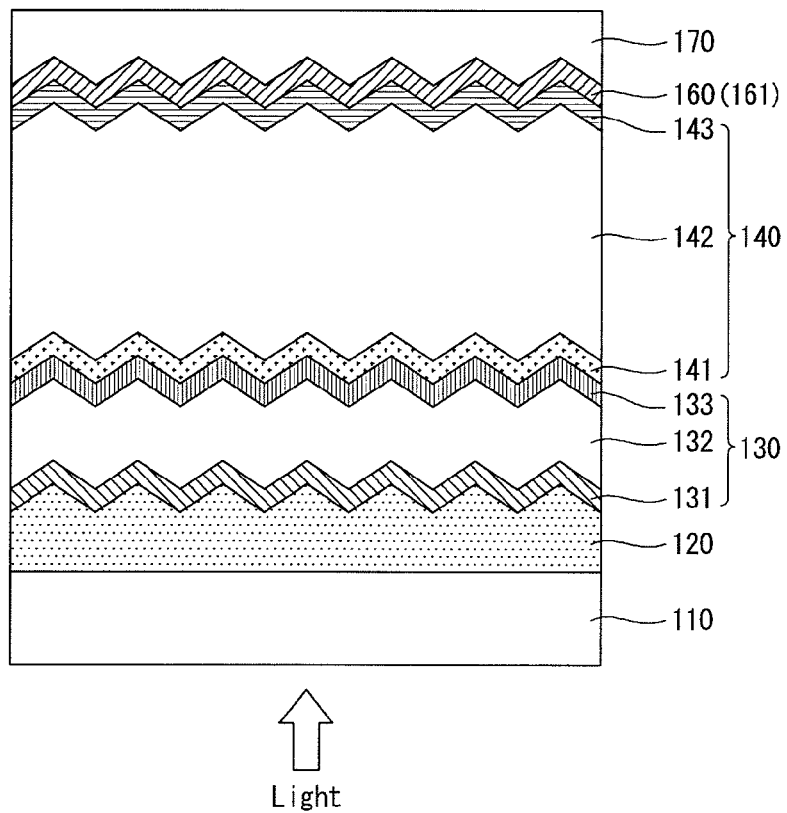
FIG. 5 is a table of a ratio of quantum efficiency versus a wavelength in the modification embodiment shown in FIG. 3.
FIG. 6 is a partial cross-sectional view schematically illustrating a double junction silicon thin film solar cell according to a second example embodiment of the invention.

FIGS. 4 and 5 are a graph of quantum efficiency values versus a long wavelength band and a table of a ratio of quantum efficiency values versus a wavelength in the modification embodiment of the single junction silicon thin film solar cell shown in FIG. 3, respectively.

In FIGS. 4 and 5, a thickness of the first reflection layer 161 was 100 nm, and a thickness of the second reflection layer 162 was 10 nm.

In FIG. 4, a dotted line A indicates quantum efficiency values of the related art back reflection layer which has the thickness of 100 nm and is formed of Al-doped zinc oxide (ZnO:Al). A solid line B indicates quantum efficiency values of the back reflection layer 160 having the structure shown in FIG. 3.

Referring to FIGS. 4 and 5, the quantum efficiency values B of the back reflection layer 160 according to the modification embodiment shown in FIG. 3 were greater than the quantum efficiency values A of the related art back reflection layer in an infrared wavelength band equal to or greater than 650 nm. Further, a difference between the quantum efficiency values B and the quantum efficiency values A further increases in the long wavelength, as is shown for up to 1100 nm.

Further, a current density Jsc of the solar cell according to the modification embodiment (indicating the quantum efficiency values B) was greater than a current density Jsc of the related art solar cell (indicating the quantum efficiency values A) throughout the entire wavelength band by about 2%.

Hereinafter, silicon thin film solar cells according to other example embodiments of the invention are described with reference to FIGS. 6 to 11. Structures and components identical or equivalent to those described in the first and other example embodiments are designated with the same reference numerals, and a further description may be briefly made or may be entirely omitted.

FIG. 6 schematically illustrates a silicon thin film solar cell according to a second example embodiment of the invention. More specifically, FIG. 6 is a partial cross-sectional view of a double junction silicon thin film solar cell according to the second example embodiment of the invention.

The double junction silicon thin film solar cell according to the second example embodiment of the invention further includes a second photoelectric conversion unit 140 between a first photoelectric conversion unit 130 and a back reflection layer 160.

The second photoelectric conversion unit 140 is a microcrystalline silicon cell using microcrystalline silicon (μc-Si). The second photoelectric conversion unit 140 has an optical band gap of about 1.1 eV and mostly absorbs light of long wavelength band from red light to near infrared light. The second photoelectric conversion unit 140 may be formed of materials other than microcrystalline silicon (μc-Si).

Similar to the first photoelectric conversion unit 130, the second photoelectric conversion unit 140 includes a second p-type doped layer 141, a second intrinsic semiconductor layer 142, and a second n-type doped layer 143, that are sequentially formed on a first n-type doped layer 133 of the first photoelectric conversion unit 130. The second p-type doped layer 141, the second intrinsic semiconductor layer 142, and the second n-type doped layer 143 may be formed using the CVD method such as the PECVD method in the same manner as the first photoelectric conversion unit 130.

The second p-type doped layer 141 may be formed by adding a gas containing impurities of a group III element such as boron (B), gallium (Ga), and indium (In) to a raw gas containing silicon (Si), similar to the first p-type doped layer 131.

The second intrinsic semiconductor layer 142 prevents or reduces a recombination of carriers and absorbs light, similar to a first intrinsic semiconductor layer 132. Hence, the second intrinsic semiconductor layer 142 mostly absorbs light of the long wavelength band, and the carriers (i.e., electrons and holes) are mostly produced in the second intrinsic semiconductor layer 142. In the second example embodiment of the invention, the second intrinsic semiconductor layer 142 may be formed of hydrogenated microcrystalline silicon (μc-Si:H) and may have a thickness of about 1,500 nm to 2,000 nm. A thickness of the second intrinsic semiconductor layer 142 may be greater than a thickness of the first intrinsic semiconductor layer 132, so as to sufficiently absorb light of the long wavelength band.

The second n-type doped layer 143 may be formed by adding a gas containing impurities of a group V element such as phosphorus (P), arsenic (As), and antimony (Sb) to a raw gas containing silicon (Si).

Similar to the first photoelectric conversion unit 130, the second p-type doped layer 141 and the second n-type doped layer 143 of the second photoelectric conversion unit 140 form a p-n junction with the second intrinsic semiconductor layer 142 interposed therebetween. Hence, electrons and holes produced in the second intrinsic semiconductor layer 142 are separated and move in different directions. For example, the holes move to a TCO electrode 120 through the second p-type doped layer 141 and are collected by the TCO electrode 120, and the electrons move to a back electrode 170 through the second n-type doped layer 143 and are collected by the back electrode 170.

Figures 7, 8:
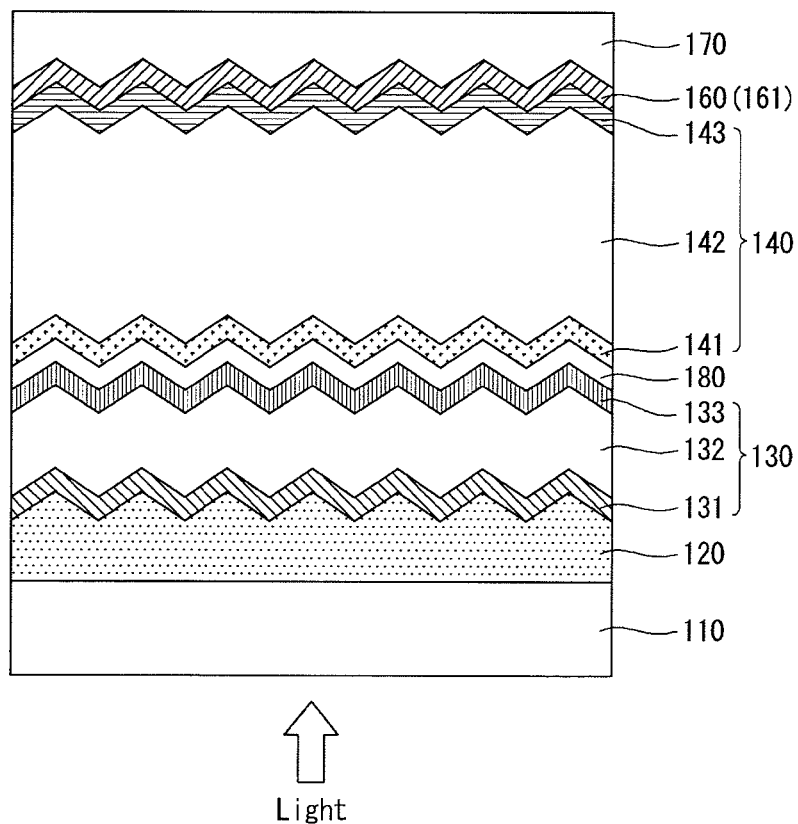
FIG. 7 is a table illustrating light characteristics and efficiency of a double junction silicon thin film solar cell including a first reflection layer formed of hydrogenated microcrystalline silicon oxide.
FIG. 8 is a partial cross-sectional view illustrating a modification embodiment of the double junction silicon thin film solar cell shown in FIG. 6.

FIG. 7 is a table illustrating light characteristics and efficiency of a double junction silicon thin film solar cell including a first reflection layer formed of hydrogenated microcrystalline silicon oxide.

Referring to FIG. 7, in a silicon thin film solar cell including a back reflection layer formed of Al-doped zinc oxide (ZnO:Al), a current QEJsc(Bot) of a second intrinsic semiconductor layer of a second photoelectric conversion unit formed of hydrogenated microcrystalline silicon was lower than a current QEJsc(Top) of a first intrinsic semiconductor layer of a first photoelectric conversion unit formed of hydrogenated amorphous silicon.

On the other hand, when a first reflection layer 161 formed of hydrogenated microcrystalline silicon oxide (μc-SiOx:H) is used, a current QEJsc(Top) and a fill factor FF of the first intrinsic semiconductor layer 132 were substantially equal to the silicon thin film solar cell including the back reflection layer formed of Al-doped zinc oxide (ZnO:Al). However, a current QEJsc(Bot), a total current QEJsc(Tot), an open-circuit voltage Voc(V), and a short-circuit current density of the second intrinsic semiconductor layer 142 were greater than the silicon thin film solar cell including the back reflection layer formed of Al-doped zinc oxide (ZnO:Al). As a result, efficiency Eff of the silicon thin film solar cell including the first reflection layer 161 increased.

Hereinafter, a modification embodiment of the double junction silicon thin film solar cell shown in FIG. 6 is described with reference to FIG. 8. The silicon thin film solar cell according to the modification embodiment shown in FIG. 8 has the same configuration as the silicon thin film solar cell shown in FIG. 6, except a middle reflection layer 180 disposed between the first photoelectric conversion unit 130 and the second photoelectric conversion unit 140.

The middle reflection layer 180 reflects light of a short wavelength band toward the first photoelectric conversion unit 130 and transmits light of a long wavelength band toward the second photoelectric conversion unit 140.

The middle reflection layer 180 may be formed using the same material as the first reflection layer 161 or using the same material as the second reflection layer 162 (refer to FIG. 3). In other words, the middle reflection layer 180 may be formed of one of hydrogenated microcrystalline silicon oxide (μc-SiOx:H) and Al-doped zinc oxide (ZnO:Al). Further, the middle reflection layer 180 may be formed using one of hydrogenated microcrystalline silicon oxide (μc-SiOx:H) and Al-doped zinc oxide (ZnO:Al) in consideration of factors such as a thickness and a refractive index of each of the first and second photoelectric conversion units 130 and 140.

When the middle reflection layer 180 is formed of hydrogenated microcrystalline silicon oxide (μc-SiOx:H), a thickness of the middle reflection layer 180 may be properly set to several tens of nanometers (nm) to 200 nm.

Further, the back reflection layer 160 of the double junction silicon thin film solar cell shown in FIGS. 6 and 8 may have a double-layered structure including the first reflection layer 161 and a second reflection layer in the same manner as FIG. 3.

Figure 9:
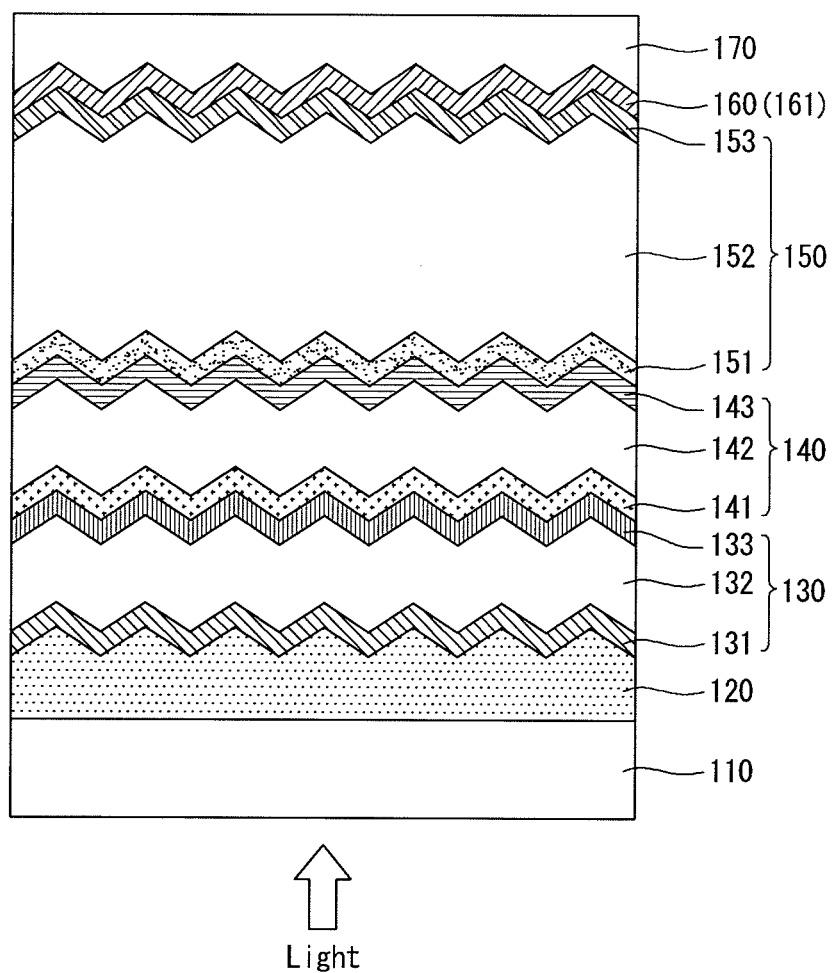
FIG. 9 is a partial cross-sectional view schematically illustrating a triple junction silicon thin film solar cell according to a third example embodiment of the invention.

FIG. 9 schematically illustrates a silicon thin film solar cell according to a third example embodiment of the invention. More specifically, FIG. 9 is a partial cross-sectional view of a triple junction silicon thin film solar cell according to the third example embodiment of the invention.

The triple junction silicon thin film solar cell according to the third example embodiment of the invention further includes a third photoelectric conversion unit 150 between a second photoelectric conversion unit 140 and a back reflection layer 160.

The third photoelectric conversion unit 150 is a microcrystalline silicon cell using microcrystalline silicon (μc-Si). The third photoelectric conversion unit 150 has an optical band gap of about 1.1 eV and mostly absorbs light of long wavelength band from red light to near infrared light. The third photoelectric conversion unit 150 may be formed of materials other than microcrystalline silicon (μc-Si).

The third photoelectric conversion unit 150 includes a third p-type doped layer 151, a third intrinsic semiconductor layer 152, and a third n-type doped layer 153, that are sequentially formed on a second n-type doped layer 143 of the second photoelectric conversion unit 140. The third p-type doped layer 151, the third intrinsic semiconductor layer 152, and the third n-type doped layer 153 may be formed using the CVD method such as the PECVD method in the same manner as the first and second photoelectric conversion units 130 and 140.

The third p-type doped layer 151 may be formed by adding a gas containing impurities of a group III element such as boron (B), gallium (Ga), and indium (In) to a raw gas containing silicon (Si). The third intrinsic semiconductor layer 152 may be formed of hydrogenated microcrystalline silicon (μc-Si:H). The third n-type doped layer 153 may be formed by adding a gas containing impurities of a group V element such as phosphorus (P), arsenic (As), and antimony (Sb) to a raw gas containing silicon (Si).

When the third intrinsic semiconductor layer 152 is formed of hydrogenated microcrystalline silicon (μc-Si:H), a second intrinsic semiconductor layer 142 may be formed of hydrogenated amorphous silicon (a-Si:H).

Figure 10:
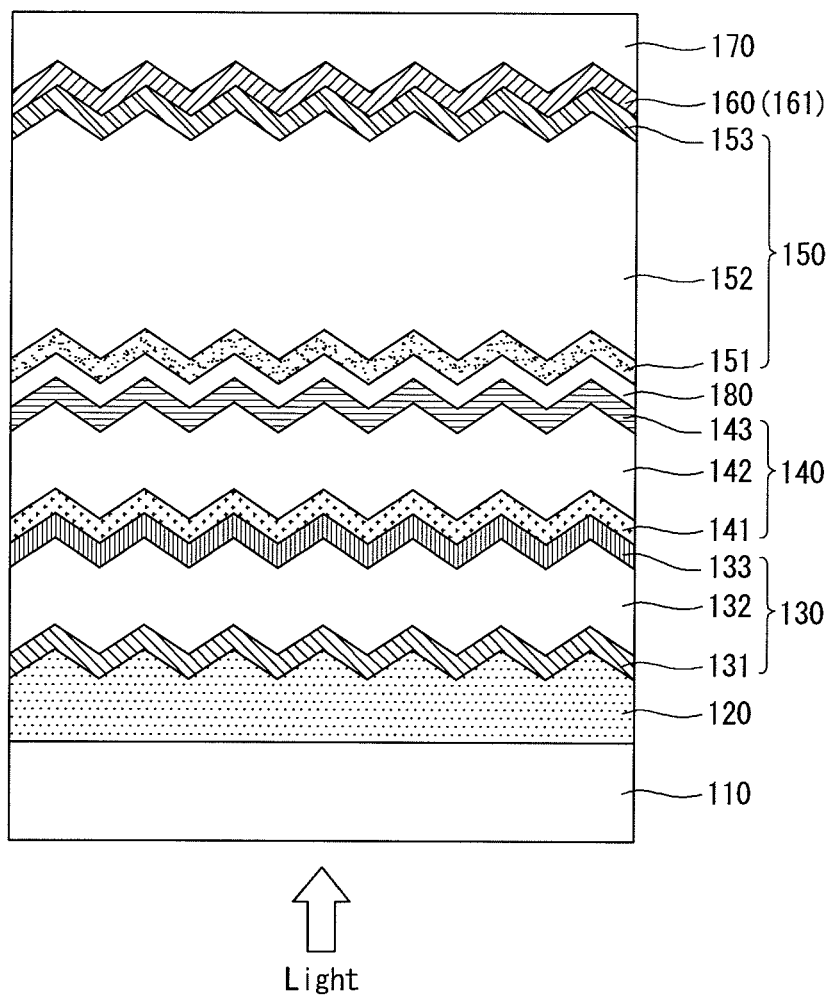
FIGS. 10 and 11 are partial cross-sectional views illustrating modification embodiments of the triple junction silicon thin film solar cell shown in FIG. 9.

FIG. 10 illustrates a modification embodiment of the triple junction silicon thin film solar cell shown in FIG. 9. In the modification embodiment, one middle reflection layer is formed between the first, second, and third photoelectric conversion units 130, 140, and 150. For example, as shown in FIG. 10, a middle reflection layer 180 is formed between the second photoelectric conversion unit 140 and the third photoelectric conversion unit 150. Alternatively, the middle reflection layer 180 may be formed between the first photoelectric conversion unit 130 and the second photoelectric conversion unit 140. As described above with reference to FIG. 8, the middle reflection layer 180 may be formed of hydrogenated microcrystalline silicon oxide (μc-SiOx:H) or Al-doped zinc oxide (ZnO:Al). Further, the middle reflection layer 180 may be formed using one of hydrogenated microcrystalline silicon oxide (μc-SiOx:H) and Al-doped zinc oxide (ZnO:Al) in consideration of factors such as a thickness and a refractive index of each of the first, second, and third photoelectric conversion units 130, 140, and 150.

Figure 11:
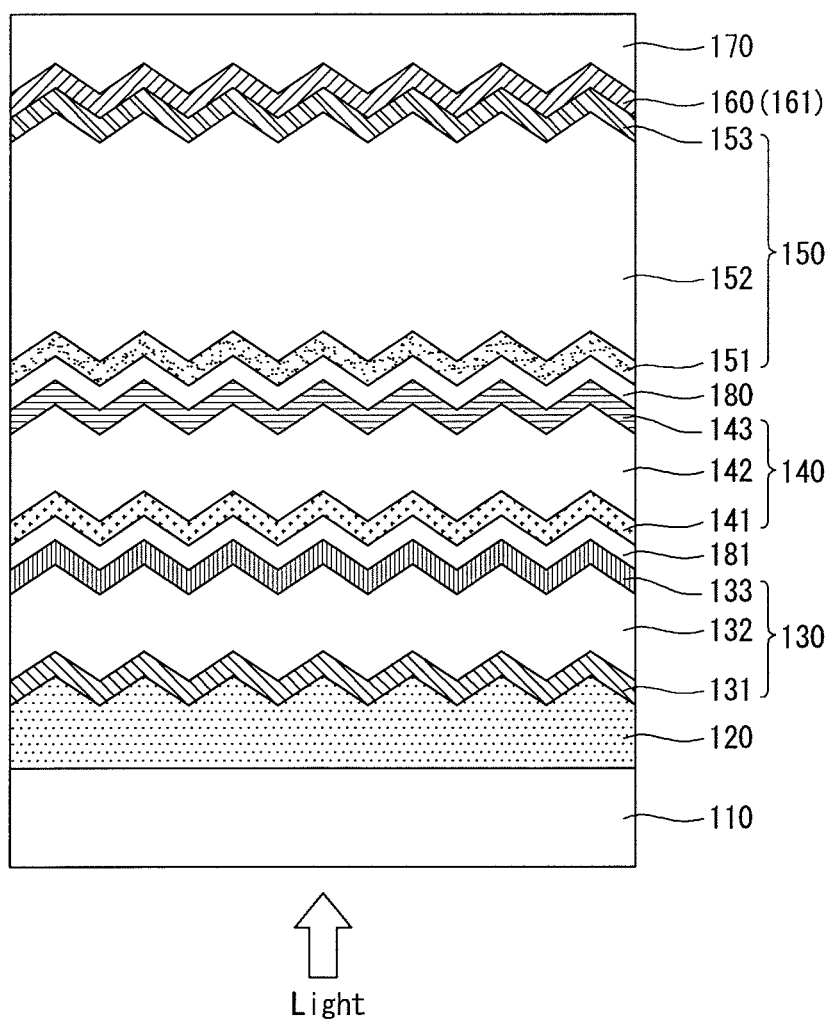

FIG. 11 illustrates another modification embodiment of the triple junction silicon thin film solar cell shown in FIG. 9. As shown in FIG. 11, one middle reflection layer 181 is formed between the first photoelectric conversion unit 130 and the second photoelectric conversion unit 140, and another middle reflection layer 180 is formed between the second photoelectric conversion unit 140 and the third photoelectric conversion unit 150.

In FIG. 11, the two middle reflection layers 181 and 180 are formed of the same material, and thus have the same characteristics and structure. However, the two middle reflection layers 181 and 180 may be formed of different materials. For example, the two middle reflection layers 181 and 180 may be formed using one of hydrogenated microcrystalline silicon oxide (μc-SiOx:H) and Al-doped zinc oxide (ZnO:Al). Alternatively, the two middle reflection layers 181 and 180 may be formed using hydrogenated microcrystalline silicon oxide (μc-SiOx:H) and Al-doped zinc oxide (ZnO:Al), respectively. In this instance, the middle reflection layer 181 between the first photoelectric conversion unit 130 and the second photoelectric conversion unit 140 may be formed using hydrogenated microcrystalline silicon oxide (μc-SiOx:H), and the middle reflection layer 180 between the second photoelectric conversion unit 140 and the third photoelectric conversion unit 150 may be formed using Al-doped zinc oxide (ZnO:Al).

In addition, the formation materials of the two middle reflection layers 181 and 180 may be selected in consideration of factors such as a thickness and a refractive index of each of the first, second, and third photoelectric conversion units 130, 140, and 150.

Further, the back reflection layer 160 of the triple junction silicon thin film solar cell shown in FIGS. 9 to 11 may have a double-layered structure including the first reflection layer 161 and a second reflection layer in the same manner as FIG. 3.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A silicon thin film solar cell comprising:
   a substrate on which light is incident, the substrate having a front surface and a back surface;
   a first electrode positioned on the back surface opposite the front surface of the substrate on which the light is incident, the first electrode formed of a transparent conductive material;
   a second electrode positioned on the first electrode;
   a back reflection layer reflecting an incident light back towards the first electrode, the back reflection layer including a first reflection layer and a second reflection layer between the first reflection layer and the second electrode, the first reflection layer formed of a material having an absorption coefficient equal to or less than 400 $cm^{-1}$ with respect to light having a wavelength equal to or greater than 700 nm and the second reflection layer formed of a material having an absorption coefficient equal to or greater than 400 $cm^{-1}$ with respect to light having a wavelength equal to or greater than 700 nm; and
   a plurality of photoelectric conversion units between the first electrode and the back reflection layer and including a first photoelectric conversion unit directly contacting the first reflection layer and a second photoelectric conversion unit between the first electrode and the first photoelectric conversion unit,
   wherein the first reflection layer entirely covers a back surface of the first photoelectric conversion unit,
   wherein the first reflection layer is formed of hydrogenated microcrystalline silicon oxide (μc-SiOx:H), and the first photoelectric conversion unit includes microcrystalline silicon (μc-Si),
   wherein a thickness of the first reflection layer is greater than a thickness of the second reflection layer,
   wherein the first reflection layer and the second reflection layer are respectively formed of a single-layer,
   wherein a front surface of the first reflection layer directly contacts a back surface of the first photoelectric conversion unit, a back surface of the first reflection layer directly contacts a front surface of the second reflection layer, and a back surface of the second reflection layer directly contacts a front surface of the second electrode, and
   wherein the incident light is sequentially transmitted from the first electrode to the first reflection layer.

2. The silicon thin film solar cell of claim 1, wherein the first photoelectric conversion unit is formed of hydrogenated microcrystalline silicon (μc-Si:H), and the first reflection layer directly contacts a back surface of an n-type or a p-type doped layer included in the first photoelectric conversion unit.

3. The silicon thin film solar cell of claim 1, further comprising a middle reflection layer positioned between the first photoelectric conversion unit and the second photoelectric conversion unit.

4. The silicon thin film solar cell of claim 3, wherein the middle reflection layer is formed using one of hydrogenated microcrystalline silicon oxide (μc-SiOx:H) and aluminum (Al)-doped zinc oxide (ZnO:Al).

5. The silicon thin film solar cell of claim 1, wherein the plurality of photoelectric conversion units further include a third photoelectric conversion unit between the first electrode and the second photovoltaic conversion unit.

6. The silicon thin film solar cell of claim 5, further comprising at least one middle reflection layer positioned between the first and second photoelectric conversion units, between the second and third photoelectric conversion units, or each of between the first and second photoelectric conversion units and between the second and third photoelectric conversion units.

7. The silicon thin film solar cell of claim 6, wherein the at least one middle reflection layer is formed using one of hydrogenated microcrystalline silicon oxide (μc-SiOx:H) and Al-doped zinc oxide (ZnO:Al).

8. The silicon thin film solar cell of claim 1, wherein an electrical conductivity of the second reflection layer is greater than an electrical conductivity of the first reflection layer.

9. The silicon thin film solar cell of claim 8, wherein the second reflection layer is formed of Al-doped zinc oxide (ZnO:Al).

10. The silicon thin film solar cell of claim 9, further comprising a middle reflection layer positioned between the first photoelectric conversion unit and the second photoelectric conversion unit.

11. The silicon thin film solar cell of claim 10, wherein the middle reflection layer is formed using one of hydrogenated microcrystalline silicon oxide (μc-SiOx:H) and Al-doped zinc oxide (ZnO:Al).

12. The silicon thin film solar cell of claim 9, wherein the plurality of photoelectric conversion units further include a third photoelectric conversion unit between the first electrode and the second photovoltaic conversion unit.

13. The silicon thin film solar cell of claim 12, further comprising at least one middle reflection layer is positioned between the first and second photoelectric conversion units, between second and third photoelectric conversion units, or each of between the first and second photoelectric conversion units and between the second and third photoelectric conversion units.

14. The silicon thin film solar cell of claim 13, wherein the at least one middle reflection layer is formed using one of hydrogenated microcrystalline silicon oxide (μc-SiOx:H) and Al-doped zinc oxide (ZnO:Al).

* * * * *